(12) United States Patent
Littau et al.

(10) Patent No.: US 8,027,037 B2
(45) Date of Patent: Sep. 27, 2011

(54) METHOD FOR EVALUATING MICROSTRUCTURES ON A WORKPIECE BASED ON THE ORIENTATION OF A GRATING ON THE WORKPIECE

(75) Inventors: Mike Littau, Bend, OR (US); Darren Forman, Bend, OR (US); Chris Raymond, Bend, OR (US); Steven Hummel, Bend, OR (US)

(73) Assignee: Nanometrics Incorporated, Milpitas, CA (US)

( * ) Notice: Subject to any disclaimer, the term of this patent is extended or adjusted under 35 U.S.C. 154(b) by 0 days.

(21) Appl. No.: 12/695,987

(22) Filed: Jan. 28, 2010

(65) Prior Publication Data

US 2010/0135571 A1    Jun. 3, 2010

Related U.S. Application Data

(63) Continuation of application No. 11/372,757, filed on Mar. 10, 2006, now Pat. No. 7,656,542.

(51) Int. Cl.
*G01B 11/00* (2006.01)
(52) U.S. Cl. ............... 356/388; 356/625; 356/237.6; 356/239.3
(58) Field of Classification Search .... 356/237.1–237.6, 356/239.3, 388, 625
See application file for complete search history.

(56) References Cited

U.S. PATENT DOCUMENTS

| | | | |
|---|---|---|---|
| 6,782,337 B2 | 8/2004 | Wack et al. | |
| 6,898,537 B1 | 5/2005 | McGahan | |
| 7,697,746 B2 * | 4/2010 | Kawaguchi | 702/40 |
| 2006/0244969 A1 * | 11/2006 | Ryan et al. | 356/446 |
| 2008/0306719 A1 * | 12/2008 | Freier | 703/13 |

* cited by examiner

*Primary Examiner* — Gregory J Toatley
*Assistant Examiner* — Iyabo S Alli
(74) *Attorney, Agent, or Firm* — Silicon Valley Patent Group LLP

(57) ABSTRACT

In a measuring system, a method for evaluating parameters of a workpiece includes measuring a periodic structure, such as a grating, on the workpiece to produce image data. An orientation of features in the image data, produced by higher order diffractions from the periodic structure, is identified. An orientation of the periodic structure is determined based on the orientation of the features in the image data. The image data is then modified, based on the orientation of the periodic structure, to correlate with, and for comparison to, simulated image data to ascertain parameters of the workpiece. Alternatively, optical components in the measuring system, or the workpiece itself, are adjusted to provide a desired alignment between the optical components and the periodic structure. A microstructure on the workpiece may then be measured, and the resulting image data may be compared to the simulated image data to ascertain parameters of the microstructure.

19 Claims, 3 Drawing Sheets

Image
Grating Position

METHOD FOR EVALUATING MICROSTRUCTURES ON A WORKPIECE BASED ON THE ORIENTATION OF A GRATING ON THE WORKPIECE

CROSS REFERENCE TO RELATED APPLICATIONS

This application is a continuation application of U.S. patent application Ser. No. 11/372,757, filed Mar. 10, 2006, entitled "Method for Evaluating Microstructures on a Workpiece Based on the Orientation of a Grating on the Workpiece," which is incorporated herein by reference in its entirety.

BACKGROUND

Semiconductor devices and other microelectronic devices are typically manufactured on a wafer or workpiece having a large number of individual dies (e.g., chips). Each wafer undergoes several different procedures to construct the switches, capacitors, conductive interconnects, and other components of a device. For example, a wafer may be processed using lithography, implanting, etching, deposition, planarization, annealing, and other procedures that are repeated to construct a high density of features. One aspect of manufacturing microelectronic devices is evaluating the wafers to ensure that the microstructures meet desired specifications.

Scatterometry is one technique for evaluating several parameters of microstructures. With respect to semiconductor devices, scatterometry may be used to evaluate film thickness, line spacing, trench depth, trench width, and other aspects of microstructures. Many semiconductor wafers, for example, include gratings in scribe lanes between the individual dies to provide a periodic structure that can be evaluated using scatterometry equipment. One scatterometry process includes illuminating these periodic structures on a wafer and obtaining a representation of the scattered radiation returning from the periodic structures. The representation of return radiation, or the structure's "diffraction signature," is then analyzed to estimate one or more parameters of the microstructure.

One challenge of scatterometry is determining the orientation of a grating on a wafer during the scatterometry measurement process. The grating orientation is important when comparing measured scatterometry image data to model image data because it affects the diffraction signature of the grating. The grating orientation on a measured wafer must be essentially equivalent to a simulated orientation found in modeled wafer data to produce diffraction signatures that are meaningfully comparable, and to therefore determine whether the wafer meets desired specifications. Thus, if the grating orientation on the measured wafer does not match the simulated or actual grating orientation in the model image data, the diffraction signature of the measured image data cannot properly be compared to that of the model image data without first adjusting the measured image data.

Another challenge of scatterometry involves measurements on gratings where the orientation of the grating structure is not well-controlled. In the case where variability exists in the orientation of the grating due to process or manufacturing variations, this variability will affect the scatterometry measurement because the orientation of the measured grating will not match the orientation of the simulated grating, and the measured scattered data will therefore be inconsistent.

Many existing scatterometry systems include a Cartesian coordinate stage or "x-y-θ" stage for moving a wafer during measuring. In these systems, wafer movement is generally limited to three degrees of freedom within an x-y plane during measuring, namely lateral, longitudinal, and rotational movement. Some Cartesian coordinate stages may also be movable vertically, and may therefore be referred to as x-y-z-θ stages. During the scatterometry measuring process, an x-y-θ stage is generally moved within the x-y plane under the optics head of the scatterometer until all of the desired regions of the wafer are measured.

A pre-alignment tool is commonly used in scatterometry systems employing an x-y-θ stage to properly align the wafer grating relative to the scatterometer optics. For example, upon loading of the wafer into the scatterometry system, a pre-alignment tool may align the wafer grating using a notch on the wafer, which has a known orientation with respect to the grating. The wafer may then be slightly rotated, if necessary, to achieve the exact desired grating orientation relative to the optics of the scatterometry device, i.e., to align the grating such that the measured image data is comparable to the model image data to determine whether the wafer meets desired specifications. Pre-alignment systems are generally imperfect, however, and may introduce unwanted rotation of the grating orientation due to alignment errors.

Another challenge in scatterometry is introduced when a polar coordinate stage, or an "x-θ" stage, is used instead of on an x-y-θ stage. In these systems, the x-θ stage is movable in a longitudinal direction during measuring, while the wafer rotates on the x-θ stage. While this presents an advantage because any point on the wafer can be accessed using just two stages of movement, the orientation of the grating structure when it arrives beneath the imaging optic will vary depending on its location on the wafer. To compensate for this, the optical system must be rotated, which is difficult and time-consuming, or the model simulations must be performed to be consistent with the grating orientation, which is also time-consuming. As a result, x-θ polar coordinate stages have not been very useful for making typical scatterometry measurements.

SUMMARY

In a scatterometry system or other measuring system, a method for evaluating parameters of a microstructure on a workpiece includes measuring a periodic structure, such as a grating, on the workpiece to produce image data. An orientation of streaks or other features, such as intensities, phase, or other properties of the scattered light in the measured image data, produced by zero order reflections or higher order diffractions, is identified. An orientation of the periodic structure is determined based on the orientation of the streaks or other features in the measured image data. The measured image data is then modified, based on the determined orientation of the periodic structure, to correlate with the orientation of simulated image data. The measured image data is then compared to the simulated image data to ascertain parameters of the microstructure on the workpiece.

Alternatively, after the orientation of the periodic structure is determined, optical components in the measurement system or the workpiece itself may be adjusted to provide a desired alignment between the optical components and the periodic structure on the workpiece. A microstructure on the workpiece may then be measured, and the resulting measured scattered data may be compared to the simulated image data to ascertain parameters of the microstructure.

Other features and advantages of the invention will appear hereinafter. The features of the invention described above can be used separately or together, or in various combinations of one or more of them. The invention resides as well in subcombinations of the features described. Furthermore, many of the method steps described herein may be performed in a different order than that which is explicitly described.

DETAILED DESCRIPTION

Figure 1:
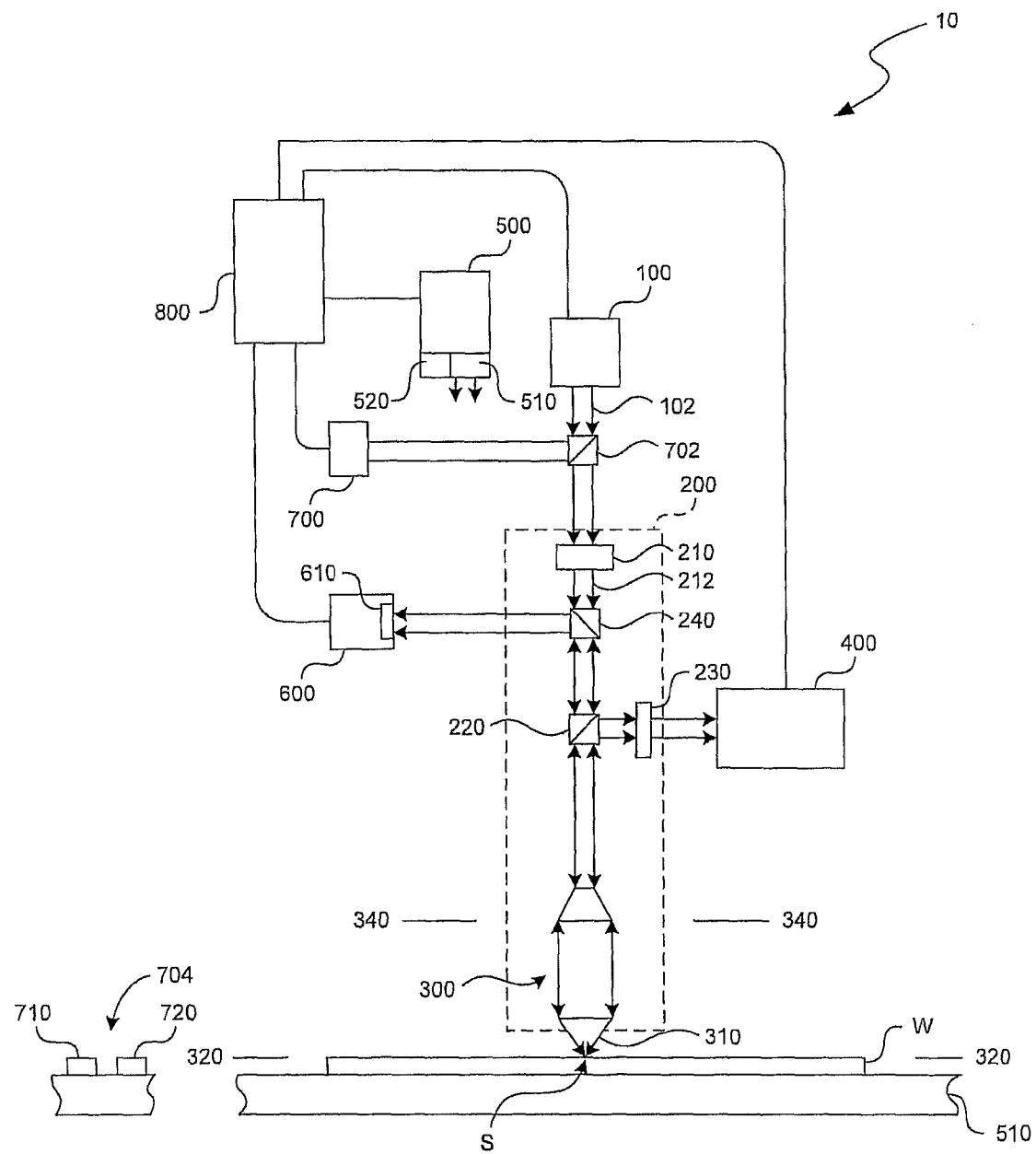
FIG. 1 is a schematic view illustrating a scatterometer according to one embodiment.

Various embodiments of the invention will now be described. The following description provides specific details for a thorough understanding of these embodiments. One skilled in the art will understand, however, that the invention may be practiced without many of these details. Additionally, some well-known structures or functions may not be shown or described in detail so as to avoid unnecessarily obscuring the relevant description of the various embodiments.

The terminology used in the description presented below is intended to be interpreted in its broadest reasonable manner even though it is being used in conjunction with a detailed description of certain specific embodiments of the invention. Any terminology intended to be interpreted in any restricted manner will be overtly and specifically defined as such in this detailed description section.

Where the context permits, singular or plural terms may also include the plural or singular term, respectively. Moreover, unless the word "or" is expressly limited to mean only a single item exclusive from the other items in a list of two or more items, then the use of "or" in such a list is to be interpreted as including (a) any single item in the list, (b) all of the items in the list, or (c) any combination of items in the list.

A variety of scatterometry systems have been developed. In general, a scatterometer for evaluating microstructures on wafers or other workpieces typically includes an irradiation source, such as a laser, an optics assembly, and an object lens assembly. The irradiation source produces a beam of radiation at a predetermined wavelength or at a multitude of wavelengths. The optics assembly is aligned with the path of the beam and is configured to condition (e.g., shape, randomize, select order, diffuse, converge, diverge, collimate, etc.) the beam. The object lens assembly is aligned with the path of the beam and is positioned between the optics assembly and a workpiece site, such an x-θ stage or an x-y-θ stage.

The object lens assembly is configured to focus the conditioned beam to a spot at an object focal plane. The lens assembly (or other optics of the scatterometer) is further configured to receive scattered radiation reflecting from a workpiece at the workpiece processing site, and to present a distribution of the scattered radiation in a second focal plane. The scattered radiation may be measured in a number of different ways, including but not limited to the intensity, polarization, wavelength, and phase of the scattered light.

A scatterometer may further include a polarizer, a detector, a navigation system, or an auto-focus system. The detector is positioned to receive at least a portion of the scattered radiation distribution and configured to produce a representation of the scattered radiation distribution. The navigation system is operatively coupled to the lens assembly or to a support structure holding the workpiece, and is configured to identify and locate a desired microstructure on the workpiece. The auto-focus system is operatively coupled to the lens assembly or to the workpiece site, and is configured to position the microstructure at the object focal plane.

A scatterometer may also include a computer operatively coupled to the detector to receive the representation of the scattered radiation distribution. The computer preferably includes a database and a computer-operable medium. The database includes a plurality of simulated scattered radiation distributions corresponding to different sets of parameters of the microstructure. The computer-operable medium contains instructions that cause the computer to identify a simulated scattered radiation distribution that adequately fits the representation of the measured scattered radiation distribution.

Any suitable scatterometer, including some or all of the components described above, may be used to practice the embodiments described herein. An exemplary scatterometer is described below to provide specific details for a thorough understanding of these embodiments. A person skilled in the art will recognize, however, that a suitable scatterometer may or may not include several of these components, or that additional components may be added to the scatterometer. Some well-known structures and functions are not shown or described in detail to avoid unnecessarily obscuring the description of the various embodiments.

FIG. 1 is a schematic illustration of a scatterometer 10 according to one embodiment. The scatterometer 10 includes an irradiation source 100 for generating a beam 102 at a desired wavelength. The irradiation source 100 may be a laser system or a lamp capable of producing (a) the beam 102 at a single wavelength, (b) a plurality of beams at different wavelengths, or (c) any other output having a single wavelength or a plurality of wavelengths.

In many applications directed to assessing microstructures on semiconductor workpieces, the irradiation source 100 is a laser that produces beams having wavelengths in the range of approximately 200 to 475 nm. In one embodiment, the irradiation source 100 may include a plurality of different lasers or filters to produce a first beam having a first wavelength of approximately 200 to 300 nm and a second beam having a second wavelength of approximately 375 to 475 nm. For example, the first wavelength may be approximately 266 nm and the second wavelength may be approximately 405 nm, or in another embodiment the first wavelength may be approximately 244 nm and the second wavelength may be approximately 457 nm.

As such, a workpiece W can be irradiated with one or more beams having one or more wavelengths less than 500 nm. Longer wavelengths may, however, be used in other embodiments. For example, a third wavelength of approximately 633 nm may be used. The irradiation source 100 may, of course, produce additional or alternative beams having shorter or longer wavelengths in the UV spectrum, visible spectrum, or other suitable spectrum. The irradiation source 100 may further include a fiber optic cable for transmitting the beam 102 through a portion of the apparatus.

The scatterometer 10 further includes an optical system 200 positioned between the irradiation source 100 and the workpiece W. In one embodiment, the optical system 200 includes a first optics assembly 210 that conditions the beam 102 to form a conditioned beam 212. The first optics assembly 210 may, for example, include a beam diffuser/randomizer that diffuses and randomizes radiation to reduce or eliminate the coherence of the beam 102. The first optics assembly 210 may also include a beam element that shapes the beam to have a desired cross-sectional dimension, shape, or convergence-divergence. The beam element may, for example, shape the beam 212 to have a circular, rectilinear, or other suitable cross-sectional shape for presentation to additional optical elements downstream from the first optics assembly 210.

The optical system 200 may further include an object lens assembly 300 that focuses the conditioned beam 212 for presentation to the workpiece W and receives radiation reflected from the workpiece W. The object lens assembly 300 is configured to receive the conditioned beam 212 and to form a convergent beam 310 focused at a discrete focus area S on an object focal plane 320. The convergent beam 310 has a conical shape if the conditioned beam 212 has a circular cross-section, but in other embodiments the convergent beam 310 may have other shapes.

For example, when the conditioned beam 212 has a rectilinear cross-section, the convergent beam 310 has a pyramidal shape. The convergent beam 310 may have a range of incidence angles, including altitude angles of 0° to greater than approximately 90°, or 0° to greater than approximately 70°, or 0° to greater than approximately 45°, or approximately 15° to 70°, and azimuth angles of 0° to greater than 90°, or 0° to 360°, depending on a given application and features being measured. The altitude angle is the angle from a reference vector normal to the object focal plane 320, and the azimuth angle is the angle in a plane parallel to the object focal plane 320 and normal to the reference vector. The large range of incidence angles generates a large number of unique data points that enable accurate evaluations of several parameters of the microstructure.

The focus area at the object focal plane 320 preferably has a size and shape suitable for evaluating the particular microstructure. For example, when the microstructure is a grating or other structure on a workpiece having a maximum dimension of approximately 10-40 µm, then the focus area is also approximately 10-40 µm. The size of the focal area is preferably not greater than the size of the microstructure so that radiation does not reflect from features located beyond the particular microstructure. In many applications, therefore, the object lens assembly 300 is configured to produce a spot size generally less than 40 µm, and more preferably not greater than 30 µm. The object lens assembly 300 may, however, be configured to produce any suitable spot size and focus area.

The object lens assembly 300 is further configured to collect scattered radiation reflecting from the workpiece W, and to present the scattered radiation on a second focal plane 340. The object lens assembly 300, more particularly, presents the scattered radiation in a manner that provides a distribution of the scattered radiation at the second focal plane 340. In one embodiment, for example, the object lens assembly 300 may direct the scattered radiation coming at particular angles from the object focal plane 320 to corresponding points on the second focal plane 340.

The optical system 200 may further include a beam splitter 220 through which the conditioned beam 212 passes to the object lens assembly 300, and from which a portion of the return beam propagating away from the second focal plane 340 is split and redirected. The optical system 200 may optionally include a second optics assembly 230 for receiving the split portion of the return beam from the beam splitter 220.

The second optics assembly is preferably configured to prepare the return beam for imaging by an imaging device.

The scatterometer 10 further includes a detector 400 positioned to receive the scattered radiation distribution propagating back from the second focal plane 340. The detector 400 may be a CCD array, a CMOS imager, or another suitable camera, or may be any other suitable energy sensor(s) for accurately measuring the scattered radiation distribution. The detector 400 is preferably configured to provide or otherwise generate a representation of the scattered radiation distribution. For example, the representation of the scattered radiation distribution may be data stored in a database, an image suitable for representation on a display, or other suitable characterizations of the scattered radiation distribution.

The scatterometer 10 may further include a navigation system 500 and an auto-focus system 600. The navigation system 500 may include a light source 510 for illuminating a portion of the workpiece W, and optics 520 for viewing the workpiece W. The navigation system 500 may have a low magnification capability for locating the general region of the microstructure on the workpiece (e.g., global alignment), and a high magnification capability for precisely identifying the location of the microstructure. Several embodiments of the navigation system may use the irradiation source 100 and components of the optical system 200. The navigation system 500 provides information to move the object lens assembly 300 or a workpiece holder or workpiece site 510, such as an x-θ stage or an x-y-θ stage, to accurately position the focus area of the object lens assembly 300 at the desired microstructure on the workpiece W.

The auto-focus system 600 may include a focus array 610, and the optical system 200 may include an optional beam splitter 240 for directing radiation returning from the workpiece W to the focus array 610. The auto-focus system 600 is operatively coupled to the object lens assembly 300 or to the workpiece site 510 to accurately position the microstructure on the workpiece W at the object focal plane 320 of the object lens assembly 300. The navigation system 500 and the auto-focus system 600 enable the scatterometer 10 to evaluate extremely small features of very small microstructures on semiconductor devices or other microelectronic devices.

The scatterometer 10 may further include a calibration system for monitoring the intensity of the beam 102 and maintaining the accuracy of the other system components. The calibration system (a) monitors the intensity, phase, polarization, wavelength, or other beam properties of the beam 102 in real time, (b) provides an accurate reference reflectance for the detector 400 to ensure the accuracy of the scatterometer, and (c) provides angular calibration of the system.

In one embodiment, the calibration system includes a detector 700 and a beam splitter 702 that directs a portion of the initial beam 102 to the detector 700. The detector 700 monitors changes in the intensity of the beam 102 in real-time to continuously maintain the accuracy of the measured scattered radiation distribution of the radiation from the workpiece W. The detector 700 may additionally or alternatively detect phase changes or a differential intensity.

The calibration system may further include a calibration unit 704 having one or more calibration members for calibrating the detector 400. In one embodiment, the calibration unit 704 includes a first calibration member 710 having a first reflectance of the wavelength of the beam, and a second calibration member 720 having a second reflectance of the wavelength of the beam. The first calibration member 710 may have a very high reflectance, and the second calibration member 720 may have a very low reflectance, to provide two data points for calibrating the detector 400.

The scatterometer 10 may further include a computer 800 operatively coupled to several of the system components. In one embodiment, the computer 800 is coupled to the irradiation source 100, the detector 400, the navigation system 500, the auto-focus system 600, and the reference detector 700. The computer 800 is programmed to operate the irradiation source 100 to produce at least a first beam having a first wavelength and preferably to also produce one or more additional beams having additional wavelengths. The computer 800 may also control the irradiation source 100 to control the output intensity of the beam. The computer 800 preferably further includes modules to operate the navigation system 500 and the auto-focus system 600 for accurately positioning the focus area of the convergent beam 310 at a desired location on the workpiece W.

The computer 800 preferably further includes a computer-operable medium for processing the measured scattered radiation distribution to provide an evaluation of the microstructure on the workpiece W. For example, the computer 800 may include a database or library having a plurality of simulated scattered radiation distributions corresponding to known parameters of the microstructure. The computer 800 may include computer-operable media to process the measured scattered radiation distribution in conjunction with the database of simulated scattered radiation distributions in a manner that selects the simulated scattered radiation distribution that best fits the measured scattered radiation distribution. Based upon the selected simulated scattered radiation distribution, the computer stores or presents the parameters of the microstructure corresponding to those of the simulated scattered radiation distribution, or an extrapolation or interpolation of such parameters.

The computer 800 may use several different processes for determining one or more parameters of the microstructure based on the measured scattered radiation distribution from the detector 400. In general, the computer 800 compares the measured scattered radiation distribution with one or more simulated scattered radiation distributions corresponding to selected parameters of the features and materials of the microstructure (e.g., height, width, line edge roughness, roundness of edge corners, spacing, film thickness, refraction index, reflection index, or other physical properties). Based on the comparison, the computer 800 then stores or provides an output of one or more parameters of the microstructure.

In one embodiment for ascertaining the feature parameters of the microstructure, the computer 800 includes a database including a large number of predetermined simulated reference scattered radiation distributions corresponding to different sets of feature parameters. The computer further includes a computer-operable medium that contains instructions that cause the computer to select a simulated scattered radiation distribution from the database that adequately fits a measured scattered radiation distribution within a desired tolerance.

The computer-operable medium may be software or hardware that evaluates the fit between the stored simulated scattered radiation distributions and the measured scattered radiation distribution in a manner that quickly selects the simulated scattered radiation distribution having the best fit with the measured scattered radiation distribution, or at least having an adequate fit within a predetermined tolerance. In the case where a plurality of the simulated scattered radiation distributions have an adequate fit with the measured scattered radiation distribution, the computer may extrapolate or interpolate between the simulated distributions. Once the computer has selected a simulated scattered radiation distribution with an adequate fit, or the best fit, the computer selects the feature parameters associated with the selected simulated distribution.

In an additional or alternative embodiment, the computer may calculate a simulated scattered radiation distribution and then perform a regression optimization to best fit the measured scattered radiation distribution with the simulated scattered radiation distribution in real time. While such regressions are widely used, they are typically very time-consuming and may not reach a desired result because the regression may not converge to within a desired tolerance.

Detailed examples of optics and lens assemblies, detectors, navigation and auto-focus systems, calibration systems, computers, and other scatterometer components are described in U.S. provisional application Ser. No. 60/669,787, filed Apr. 7, 2005, which is incorporated herein by reference. While one specific embodiment of a scatterometer 10 is shown in FIG. 1 and described above, any suitable scatterometer may be used to perform the embodiments described herein.

Figure 2A:
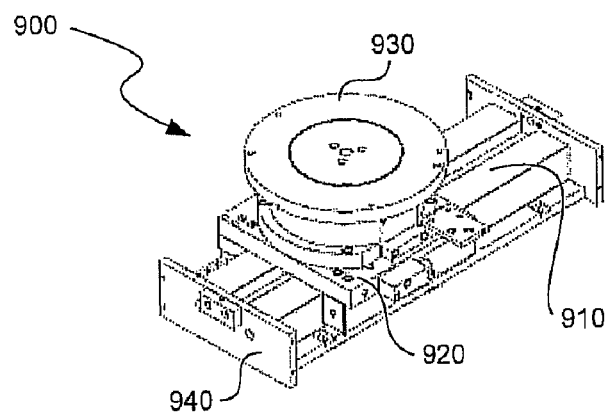
FIG. 2A is perspective view of an x-θ stage according to one embodiment.
Figure 2B:
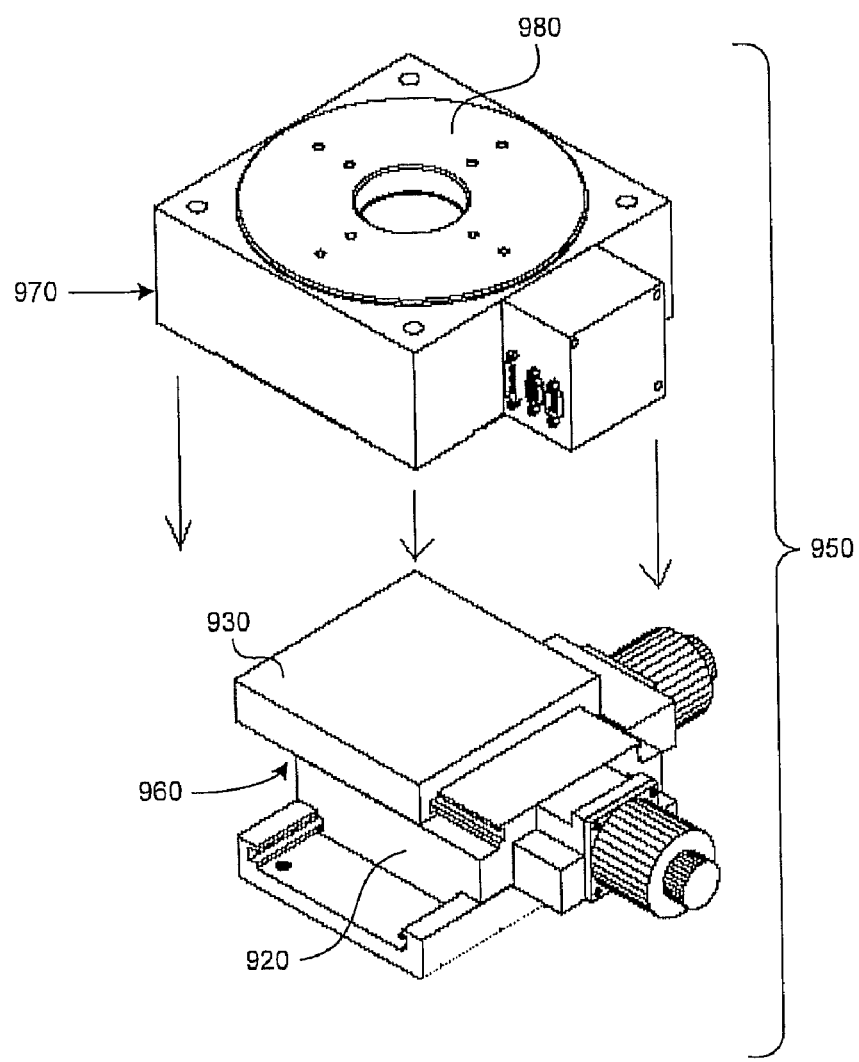
FIG. 2B is perspective view of an x-y-θ stage according to one embodiment.
Figure 3A:
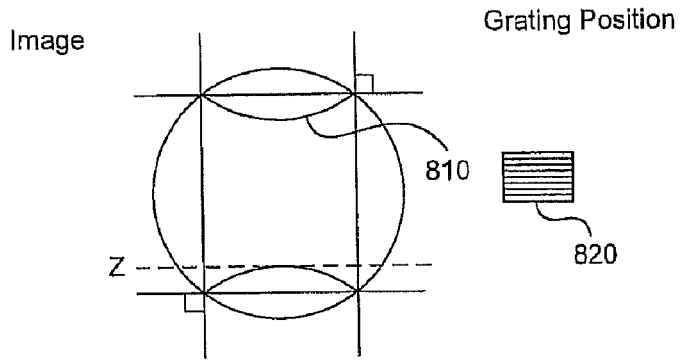
FIGS. 3A-3D are conceptual views of workpiece image data including order streaks in conjunction with conceptual views of the orientation of a grating on the workpiece relative to the order streaks.
Figure 3B:
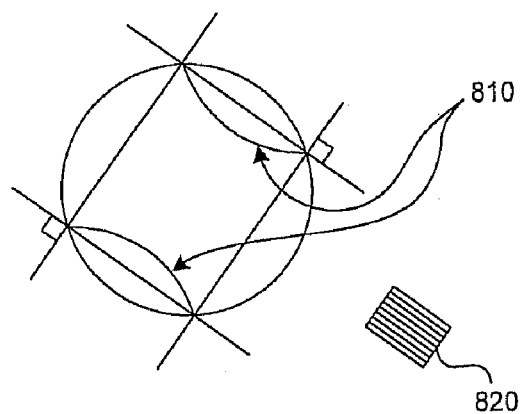
Figure 3C:
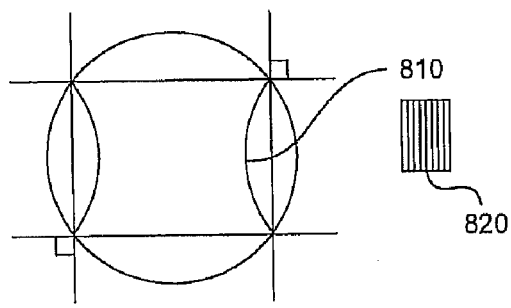
Figure 3D:
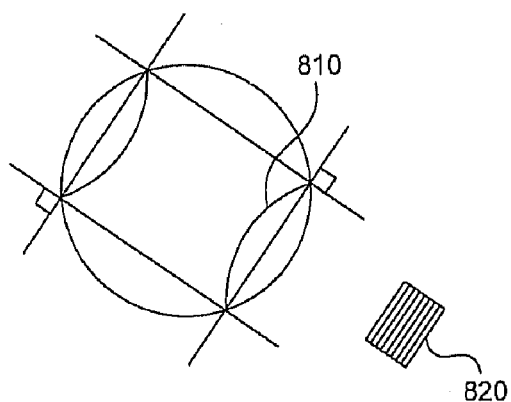

As illustrated in FIGS. 2A and 2B, the workpiece site in the scatterometer may be an x-θ stage 900, an x-y-θ stage 950, or another suitable workpiece-holder. An x-θ stage 900 is generally more compact than an x-y-θ stage 950, and therefore may be preferred in compact systems or other systems with limited available space. The x-θ stage 900 includes a linear track section 910 along which a stage section 920 is longitudinally movable. The stage section 920 includes a rotatable workpiece support 930 for holding and rotating a workpiece. The track section 910 is supported by frame sections 940.

During a scatterometry measurement process, the x-θ stage 900 moves longitudinally under the optics assembly of the scatterometer while the workpiece support 930 rotates. Due to this rotation, the orientation of a grating and of other microstructures on the workpiece surface changes relative to the optics assembly, and it is therefore very difficult to position the grating in a desired orientation relative to the optics assembly during the measuring process.

The x-y-θ stage 950, conversely, includes a first stage section 960, or an "x-y stage," including a lower stage section 920 for moving the x-y-θ stage 950 in a first longitudinal direction, and an upper stage section 930 for moving the x-y-θ stage 950 in a second longitudinal direction perpendicular to the first longitudinal direction. The x-y-θ stage 950 further includes a second stage section 970 that fits on top of the first stage section 960. The second stage section 970 includes a rotatable workpiece holder 980.

During a scatterometry measuring process, the x-y-θ stage 950 moves longitudinally under the optics assembly of the scatterometer in the first and second longitudinal directions. The workpiece holder 980 typically is rotated only to align the workpiece before the measuring process begins. A pre-alignment tool may be used to position the grating in a desired orientation relative to the optics assembly that will remain unchanged throughout the measuring process. It may be desirable in some cases, however, to eliminate the need to use a pre-alignment tool, which, due to its imperfect nature, may introduce error into the system.

Modifying the grating orientation relative to the optics assembly has a significant effect on the image data, or the "diffraction signature," produced by the measuring process. If the orientation of the grating during measuring does not match the simulated grating orientation used to produce model image data, the measured image data cannot be meaningfully compared to the model image data. As a result of existing systems not being able to readily determine or modify the grating orientation during or after measuring, every possible grating orientation must be modeled, or other time-consuming, complicated procedures must be performed, to provide a meaningful comparison between the measured data and the model data, and to determine whether the measured microstructure meets required specifications.

It would therefore be very beneficial to be able to determine the orientation of a grating (or other microstructure) on a workpiece during measuring so that a meaningful comparison to simulated or other known model data may be performed. If the grating orientation during measuring is known, then measured image data may be modified via a software correction to correlate it with simulated or model image data. Alternatively or additionally, if the grating orientation during measuring is known, the orientation of one or more system components may be adjusted to achieve the desired alignment with the workpiece, after which re-imaging of the workpiece structure may be performed to obtain measurement data that can be meaningfully compared to the simulated or model image data.

During the measurement process of a grating or other periodic structure on a workpiece, a phenomenon known as Wood's anomaly may cause "order streaks" or other features from higher order diffractions to appear in the resultant scattered radiation distribution or image data. The higher order diffractions are produced by beams reflected from or transmitted through the periodic structure, depending on whether the periodic structure is opaque or transparent. FIGS. 3A-3D illustrate conceptual examples of order streaks 810 that appear in image data produced by measuring a grating 820 on a workpiece. The grating orientation on the workpiece can be determined from these order streaks 810. More specifically, the grating 820 is oriented parallel to the tangent Z of the zenith of the order streaks 810 (the grating 820 is shown adjacent to the image data in FIGS. 3A-3D to conceptually illustrate the orientation of the grating 820 relative to the order streaks 810 generated in the image data).

In a system using an x-θ stage, or an x-y-θ stage without pre-alignment, it is unlikely that the grating orientation during measuring will correlate with the simulated or model image data. Thus, once the grating orientation is determined, one or more processes must be performed to correlate the measured image data with the simulated or model image data before a meaningful comparison can be made between them.

In one embodiment, a measuring process is performed on a grating on a workpiece. A computer determines the orientation of the grating relative to a reference frame based on the orientation of the higher order streaks or other features present in the scattered radiation distribution or measured image data. An additional measuring process may optionally be performed on any desired microstructure on the workpiece to yield a separate measurement image. A software program is then used to modify or correct the measurement image data, based on the grating orientation, to correlate it with the orientation of the simulated or model data in the reference frame.

The computer is then used to ascertain the parameters of the grating or other microstructure by selecting or determining a simulated scattered radiation distribution that best fits (or fits within a predetermined tolerance) the measured scattered radiation distribution. Optimization or regression analyses may alternatively or additionally be performed to ascertain the desired parameters. The ascertained parameters may then be used to determine whether the measured microstructure meets required specifications.

In another embodiment, a measuring process is performed on a grating on a workpiece. A computer determines the orientation of the grating relative to a reference frame based on the orientation of the higher order streaks or other features present in the scattered radiation distribution or measured image data. The optics assembly is then moved, or the optical components of the system are otherwise adjusted, to achieve a desired alignment between the grating and the system optics, based on the grating orientation. Next, a measurement image of the grating or other microstructure on the workpiece is obtained while the system optics and the grating remain in the desired alignment.

The computer is then used to ascertain the parameters of the grating or other microstructure by selecting or determining a simulated scattered radiation distribution that best fits the measured scattered radiation distribution. Optimization or regression analyses may alternatively or additionally be performed to ascertain the desired parameters. The ascertained parameters may then be used to determine whether the measured microstructure meets required specifications.

In another embodiment, in which an x-y-θ stage is used, after the grating orientation is determined, the x-y-θ stage may be moved or rotated to properly align the grating with the optical components of the measuring system. Once the desired alignment is achieved, a measurement image of a grating or other microstructure is obtained, and the computer ascertains the desired parameters of the microstructure, as described above.

By moving the x-y-θ stage to achieve the desired alignment between the system optics and the grating, the need for a separate pre-alignment tool is eliminated. This embodiment may also be applied to a system using an x-θ stage, but it may not always be possible to achieve the desired alignment in such a system because the x-θ stage is movable longitudinally along only one coordinate. Accordingly, it may not always be possible to properly position the grating relative to the system optics.

In another embodiment, in a system that includes a polarizer or an analyzer, once the grating orientation is determined the polarizer or analyzer may be rotated relative to the grating to control the polarization state of return light incident on a collector in the scatterometry system, or to control other parameters or perform other analyses. For example, once the grating orientation is determined, the polarizer may be rotated to a position in which lines on the polarizer are parallel with (i.e., "pass-through" mode) or perpendicular to (i.e., "blocked" mode) lines on the grating, or to another relative orientation, to control the direction of the electric field.

Thus, while several embodiments have been shown and described, various changes and substitutions may of course be made, without departing from the spirit and scope of the invention. Many of the method steps described herein, for example, may be performed in a different order than that which is specifically described. The invention, therefore, should not be limited, except by the following claims and their equivalents.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method for evaluating parameters of a workpiece, comprising:
   measuring a periodic structure on the workpiece to produce image data;
   identifying an orientation of a feature in the image data produced by higher-order diffractions from the periodic structure;

determining an orientation of the periodic structure based on the orientation of the feature in the image data; and performing a comparison of the image data with simulated image data to ascertain parameters of the periodic structure, wherein the determined orientation of the periodic structure is used to produce a correlation between the compared image data and simulated image data.

2. The method of claim 1, where the simulated image data is generated in advance of the measurement.

3. The method of claim 1, where the simulated image data is generated via a regression optimization.

4. The method of claim 1 wherein the determined orientation of the periodic structure is used to produce a correlation between the compared image data and simulated image data by a software program.

5. The method of claim 1 wherein the determined orientation of the periodic structure is used to produce a correlation between the compared image data and simulated image data by modifying the image data based on the orientation of the periodic structure.

6. The method of claim 1 further comprising imaging a microstructure on the workpiece, after the orientation of the periodic structure is determined, to produce measurement image data.

7. The method of claim 6 wherein performing a comparison of the image data with simulated image data to ascertain parameters of the periodic structure uses the measurement image data.

8. The method of claim 1 wherein measuring is performed by a scatterometer.

9. The method of claim 1 wherein the workpiece is supported on one of an x-θ stage and an x-y-θ stage.

10. The method of claim 1 wherein the feature in the image data comprises at least one higher order streak.

11. A system for evaluating parameters of a workpiece, comprising:
 means for measuring a periodic structure on the workpiece to produce image data;
 means for identifying an orientation of a feature in the image data produced by higher-order diffractions from the periodic structure;
 means for determining an orientation of the periodic structure, based on the orientation of the feature in the image data; and
 means for correcting for the orientation of the periodic structure to produce a correlation between the compared image data and simulated image data; and
 means for performing a comparison of the image data with the simulated image data to ascertain parameters of the periodic structure.

12. The system of claim 11 wherein the means for correcting for the orientation of the periodic structure to produce a correlation between the compared image data and simulated image data comprises a means for modifying the image data based on the orientation of the periodic structure.

13. The system of claim 11 further comprising means for polarizing return light from the workpiece.

14. The system of claim 11 further comprising means for supporting, moving, and rotating the workpiece.

15. An apparatus for evaluating parameters of a microstructure on a workpiece, comprising:
 an irradiation source for producing a beam of radiation;
 an optical system aligned with a path of the beam for focusing the beam at a focal plane;
 a workpiece site for holding the workpiece with the microstructure positioned at the focal plane;
 a detector for receiving a scattered radiation distribution diffracted from the microstructure;
 a computer including a computer operable medium containing instructions for:
  identifying an orientation of a feature in image data produced by higher order diffractions from the microstructure;
  determining an orientation of the microstructure based on the orientation of the feature in the image data; and
  performing a comparison of the image data with simulated image data to ascertain parameters of the periodic structure, wherein the determined orientation of the periodic structure is used to produce a correlation between the compared image data and simulated image data.

16. The apparatus of claim 15 wherein the computer operable medium further contains instructions for modifying the image data based on the orientation of the microstructure to correct for the orientation of the periodic structure.

17. The apparatus of claim 15 wherein the workpiece site comprises one of an x-θ stage and an x-y-θ stage.

18. The apparatus of claim 15 further comprising a polarizer in a return path of the higher order diffractions.

19. The apparatus of claim 15 wherein the optical system comprises an optics assembly for conditioning the beam, and an object lens assembly for focusing the conditioned beam.

* * * * *